(12) United States Patent
Walter et al.

(10) Patent No.: US 10,550,889 B2
(45) Date of Patent: Feb. 4, 2020

(54) SNAP-IN BUSHINGS AND PROCESS FOR HIGH-PRESSURE AND/OR HIGH TEMPERATURE MAGIC ANGLE SPINNING NUCLEAR MAGNETIC RESONANCE SPECTROSCOPY (71) Applicant: BATTELLE MEMORIAL INSTITUTE, Richland, WA (US)

(72) Inventors: Eric D. Walter, Richland, WA (US); Jesse A. Sears, Jr., Kennewick, WA (US); Hardeep S. Mehta, Richland, WA (US); David W. Hoyt, Richland, WA (US)

(73) Assignee: Battelle Memorial Institute, Richland, WA (US)

(*) Notice: Subject to any disclaimer, the term of this patent is extended or adjusted under 35 U.S.C. 154(b) by 341 days.

(21) Appl. No.: 15/225,688

(22) Filed: Aug. 1, 2016

(65) Prior Publication Data
US 2018/0031042 A1 Feb. 1, 2018

(51) Int. Cl.
*F16C 33/74* (2006.01)
*G01R 33/30* (2006.01)

(52) U.S. Cl.
CPC .............. *F16C 33/74* (2013.01); *G01R 33/30* (2013.01)

(58) Field of Classification Search
CPC .......... F16C 33/74; F16C 35/02; G01R 33/30; G01R 33/305; G01R 33/307
See application file for complete search history.

(56) References Cited

U.S. PATENT DOCUMENTS

| 5,762,103 A | 6/1998 | Gregoire |
| 6,054,857 A * | 4/2000 | Doty .................... G01R 33/307 324/321 |
| 6,298,873 B1 | 10/2001 | LeVey et al. |
| 6,585,445 B1 * | 7/2003 | Goldfarb ................. F16C 11/12 267/160 |
| 8,692,548 B2 | 4/2014 | Hoyt et al. |
| 2010/0130821 A1 * | 5/2010 | Rosemurgy ........ A61B 1/00137 600/115 |
| 2010/0251839 A1 | 10/2010 | Kim et al. |
| 2012/0146636 A1 * | 6/2012 | Hoyt .................... G01R 33/305 324/307 |
| 2014/0044598 A1 * | 2/2014 | Hu .......................... B23G 1/02 422/68.1 |
| 2014/0324022 A1 * | 10/2014 | Scribben ................. A61M 5/20 604/506 |

(Continued)

FOREIGN PATENT DOCUMENTS

DE 102010013552 11/2010
EP 0545692 6/1993

(Continued)

OTHER PUBLICATIONS

STIC search was performed on Mar. 8, 2019.*

(Continued)

*Primary Examiner* — Christopher P McAndrew
*Assistant Examiner* — Zannatul Ferdous
(74) *Attorney, Agent, or Firm* — Wells St. John P.S.

(57) ABSTRACT

Snap-in bushings are disclosed that enable sealing of sample chambers in MAS-NMR rotors for high pressure and/or high temperature operation that enhance pressure limits up to about 400 bar and temperature limits up to at least about 250° C.

20 Claims, 7 Drawing Sheets

(56) References Cited

U.S. PATENT DOCUMENTS

2016/0047867 A1\* 2/2016 Turcu .................. G01R 33/305
 324/321

FOREIGN PATENT DOCUMENTS

| EP | 1457787 A2 \* | 9/2004 | ........... G01R 33/307 |
|----|---------------|--------|-------------------------|
| EP | 1457787 A2 | 9/2004 | |
| ES | 2231643 T3 | 5/2005 | |
| WO | WO 2012/082204 | 6/2012 | |

OTHER PUBLICATIONS

Yonker, C. R., et al., The Use of Supercritical Fluids as Solvents for NMR Spectroscopy, Progress in Nuclear Magnetic Resonance Spectroscopy, 47, 2005, 95-109.

\* cited by examiner

FIG. 5

SNAP-IN BUSHINGS AND PROCESS FOR HIGH-PRESSURE AND/OR HIGH TEMPERATURE MAGIC ANGLE SPINNING NUCLEAR MAGNETIC RESONANCE SPECTROSCOPY

STATEMENT REGARDING RIGHTS TO INVENTION MADE UNDER FEDERALLY-SPONSORED RESEARCH AND DEVELOPMENT

This invention was made with Government support under Contract DE-AC05-76RL01830 awarded by the U.S. Department of Energy. The Government has certain rights in the invention.

FIELD OF THE INVENTION

The present invention relates generally to magic angle spinning (MAS) nuclear magnetic resonance (NMR) devices. More particularly, the present invention relates to bushings that enable MAS-NMR spectroscopic analyses at combined high-pressure and high-temperature conditions.

BACKGROUND OF THE INVENTION

MAS-NMR is a powerful tool for determining chemical speciation in mixed phase samples. MAS-NMR performed at conditions of combined high temperature and high pressure has not been realized for a number of reasons, leaving the monitoring of chemical reactions and transformations in situ largely unexplored. Various attempts have been made to create modifications to MAS-NMR designs to attempt to address these limitations.

One previous rotor design included a ceramic zirconia rotor configured with polymer bushings made of TOR-LON® that were secured to narrow threads positioned along the inner wall of the rotor cylinder using an epoxy adhesive. This design worked well for samples examined at lower temperatures and pressures and mild reaction conditions such as those involving methane in carbon dioxide. However, in harsh sample conditions the epoxy adhesives break down in the rotor. Sealing devices used in these rotors can also fail. Previous designs also frequently required specialized pressure loading devices to load gases into the rotor at elevated pressure conditions. Thus, these prior art rotor cylinder designs are generally not suitable for in-operando monitoring of samples undergoing reactions at combined pressures above 200 bar and temperatures above 80° C.

Due to limitations in current rotor designs, many chemical systems have not been examined and characterized by MAS-NMR. Accordingly, new bushing designs and methods are needed for sealing sample chambers in rotors without adhesives that enable operation at combined high temperature and high pressure conditions. The present invention addresses these needs.

SUMMARY OF THE INVENTION

The present invention is a novel snap-in bushing and a method for using a MAS-NMR rotor sleeve that includes sealing a sample chamber using the snap-in bushing to form a sample chamber by pushing the walls of the bushing against the internal walls of the chamber and forming a compressive seal arrangement. This seals the sample chamber in the rotor sleeve and provides a sample chamber that can operate at pressures as high as 400 Bar without the needs for an adhesive. In one embodiment the snap-in bushing includes a cylinder having two ends connected by a circumvolving wall. One of the ends is configured to fit within the MAS-NMR rotor sleeve to define a portion (usually a ceiling or a floor) of a sample chamber. The circumvolving wall typically has a ridge that extends around the cylinder at a preselected height and is configured to snap fit within an inset groove defined within an inner wall of the rotor sleeve. Preferably this bushing spans the entire diameter of the inner diameter of the rotor. In some embodiments, the ridge and the inset grooves have complimentary non-contiguous segments of preselected lengths. In some examples the bushing defines an inner bore that is configured to receive a plug within. This plug provides additional outward force against the bushing and pushes the walls of the bushing against the inner walls of the rotor sleeve. In some other applications the inner bore is threaded to allow connection with a threaded plug or other device therein.

In some applications the bushing also includes a sealing O-ring disposed within an O-ring groove that circumvolves the bushing and secures a portion of the O-ring therein. In other applications the bushing defines an inner conduit configured to allow passage of a preselected material through the conduit and a check valve operably connected to the conduit to regulate passage of a material through the conduit and into the sample chamber. Such a configuration allows the sample chamber to be directly pressurized rather than requiring the use of a pressure loading device. In some applications the walls of the bushing define slits that allows flexure of the bushing so as to assist in a forced compressive engagement within the MAS-NMR chamber. The snap-in bushing may also include a flange connected to the bushing near the sample chamber that is configured to engage the inner wall of the chamber and hold the bushing in a preselected position sample chamber. In some instances the snap-in bushing also includes a pressure release port to allow depressurization of the sample chamber.

In use the bushing is inserted into the rotor sleeve to form a sample chamber and a sample or cover gas is introduced into the sample chamber. This can be done through a one-way flow valve in the snap-in bushing prior to operation or through an introduction in the snap-in bushing while operating at a preselected pressure and temperature. In one example the snap-in bushing is a semi-flexible cylinder having two ends connected by a circumvolving wall. One of the ends is configured to define a portion of a sample chamber when inserted within a MAS-NMR rotor sleeve. The circumvolving wall has a ridge that extends around the cylinder at a preselected height and is configured to snap fit within an inset groove defined within an inner wall of the rotor sleeve to secure the bushing in the rotor sleeve by compression without an adhesive and to hold pressure within the sample chamber at pressures up to about 400 bar. The bushing also defines an inner conduit configured to allow passage of a preselected material through the conduit and a check valve operably connected to the conduit to regulate passage of a material through the conduit and into the sample chamber. The inner conduit may also be threaded and adapted for connection to a similarly threaded plug.

This bushing provides a variety of advantages over the prior art. Since it does not require the use of an adhesive, the temperature range of operation is significantly higher than prior art embodiments. In addition, it functions better at higher pressures, allows for analysis of additional types of materials and provides other advantages over the prior art.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

DETAILED DESCRIPTION

The present disclosure describes a new snap-in bushing and a method for using a MAS-NMR rotor that includes using such a bushing to form and seal a sample chamber. This sample chamber can then allow the MAS-NMR device to operate at pressures as high as 400 Bar. FIGS. 1A-6 show various examples of the present disclosure. Referring first to FIGS. 1A-G various views of one snap-in bushing are shown. In this example the snap-in bushing includes a cylinder 10 having two ends (9, 11) connected by circumvolving wall 13. One of the ends (9) is configured to fit within the MAS-NMR rotor sleeve to-devise to define a portion (usually a ceiling 4 or a floor 6) of a sample chamber 8. The circumvolving wall 13 typically has a ridge 12 that extends around the cylinder at a preselected height and is configured to snap fit within an inset groove 14 defined within an inner wall 5 of the rotor sleeve. When in place the bushing 10 is secured to the rotor sleeve by compression without an adhesive and is capable of holding pressure within the sample chamber at pressures up to about 400 bar. In some embodiments the ridge 12 and the inset groove 14 have complimentary non-contiguous segments of preselected lengths.

In one example the securing ridge 12 is a narrow strip of polymeric material positioned at a desired height along the cylinder wall of the bushing and circumvolves at least a portion thereof. The securing ridge may be continuous or discontinuous and may be positioned at almost any location along the cylinder. Preferably the securing ridge 12 is configured to couple with an inset groove 14 positioned within a portion of the inner wall 5 (not shown). The inset groove 14 is a narrow cut machined into the inner wall of the rotor sleeve wall 4 which is configured to couple with the securing ridge positioned on the outside surface of the snap-in bushing, or vice versa, forming a snap-fit coupling that secures the snap-in bushing without adhesives in the rotor sleeve for high temperature and/or high pressure operation. While this arrangement is described it is to be understood that the invention is not limited to this particular arrangement. In particular the arrangement could be flip-flopped or alternatively configured so that the inner wall of the sample chamber contains a ridge, flange, or other protrusion that engages with a complimentary dimensioned groove on the bushing to mate and connect.

In some applications the cylinder 10 also includes a sealing O-ring 26 disposed within an O-ring groove 28 that circumvolves the cylinder and secures a portion of the O-ring therein. An inner conduit or bore 18 defined within the cylinder may be configured so as to allow threaded interconnection with a plug or other device that can be positioned so as to support the walls of the cylinder and enhance the compressive engagement of the walls of the cylinder against the inner wall of the rotor sleeve. In some embodiments this inner conduit 18 may also be configured to allow passage of a preselected material through the cylinder 10. A check valve 24 may be positioned along the cylinder 10 and serve to regulate the passage of materials into the sample chamber. In some applications the walls 13 of the cylinder define slits 16 that allows flexure of the cylinder so as to assist in allowing insertion and supporting a forced compressive engagement within the MAS-NMR chamber. In some instances the snap-in bushing 10 includes an integral seal 102 (in this embodiment a flange) connected to the cylinder that is configured to engage the inner wall 5 of the chamber 8 and provide an O-ring free sealing device. In some instances the snap-in bushing further includes a pressure release port 34 to allow depressurization of the sample chamber.

In some examples the snap-in bushing 10 includes two or more slits 16 spaced around the circumference of the bushing 10 to permit flexure of the outer wall when the bushings are introduced into the rotor sleeve. When secured in the rotor sleeve, the wall of the bushing exerts outward pressure on the snap-fit coupling between the securing ridge 12 and the inset groove 14. The snap-in bushing 10 includes an inner bore 18 of a selected depth positioned at the center of the bushing with threads 20 positioned along the length thereof for threading a sealing plug 22 that seals sample chamber 8 when introduced into the rotor sleeve. In some examples the inner bore 18 converges to a tip point at the bottom of the bore to accommodate the tip of the sealing plug. The sealing plug when threaded into position in the inner bore puts an outward pressure on the snap-fit coupling between securing ridge 12 and inset groove 14 that supports and reinforces the walls of the snap-in bushing 10 rigidly in the rotor sleeve. In some examples the flow check valve 24 is a one-way valve positioned, for example, at the base of the bushing immediately above or below the sample chamber and a passageway to allow flow of gas into the sample chamber 5 through the bushing 10.

In one example, the O-ring groove 28 is machined into the bushing from the surface inward with a depth dimension that matches the outer diameter of the bore at the center of the bushing. In this instance, the upper edge of the O-ring groove is smooth and non-porous to provide a gas-tight seal when the O-ring is under pressure. In use, increases in gas pressure in the sample chamber during operation increase the back pressure exerted on the O-ring 26 increasing the force on the seal against the upper edge of the O-ring groove 28 increasing the seal in the sample chamber preventing release of gases from the sealed sample chamber during operation. Gases are retained in the sample chamber by compression of the O-ring rather than by tension. This arrangement increases the effectiveness of the sealing O-ring at operation conditions including high pressures, high temperatures, centrifugal forces; rotation speeds, magnetic fields, gravitational forces; and combinations of these various operation conditions. In one exemplary embodiment, the O-ring includes a 1-mm cross section, and an outer diameter that matches the diameter of inner bore 18. Sealing O-rings 26 may be made from high-performance polymeric materials including, but not limited to, e.g., fluoroelastomers (e.g., VITON®, Dupont Performance Elastomers, LLC, Wilmington, Del., USA), nitrile-containing elastomers (e.g., BUNA 90®, WARCO BILTRITE, Orange, Calif., USA), EPDM, silicone, FKM, FFKM, Kalrez, or other compatible materials with a suitable chemical compatibility or temperature rating.

In one embodiment, check valve 24 is positioned within bushing 10 so as to be inside the rotor sleeve when the sample chamber is loaded with sample or cover gases. In other embodiments the check valve 24 may be positioned external to the rotor sleeve. In some examples the bushing 10 also includes a sample gas release port (depressurization vent) 34, which releases or vents sample gases from the sample chamber following analysis of a sample in the sample chamber, when sealing plug 22 is removed from the rotor sleeve, as detailed further herein.

In some of the examples the snap-in bushings 10 are constructed of high performance polymers including, but not limited to, for example, polyether ether ketone polymers (e.g., PEEK®, Victrex USA, Inc., West Conshohocken, Pa., USA) polyimide polymers (e.g., VESPEL®, Dupont, Wilmington, Del., USA); polyamide-imide polymers (e.g., TORLON®, Solvay Advanced Polymers, L.L.C., Alpharetta, Ga., USA; KEL-F®, vendor, location, USA); polybenzimidazole thermoplastic polymers (e.g., CELAZOLE®, vendor, location, USA); other high performance polymers; and combinations of these various polymers. Such performance polymers (VESPEL® being exemplary) provide the bushings with high tensile strengths at least up to about 8.62E+04 kPa (12,500 psi) at a temperature rating as high as 300° C.

Figure 5:
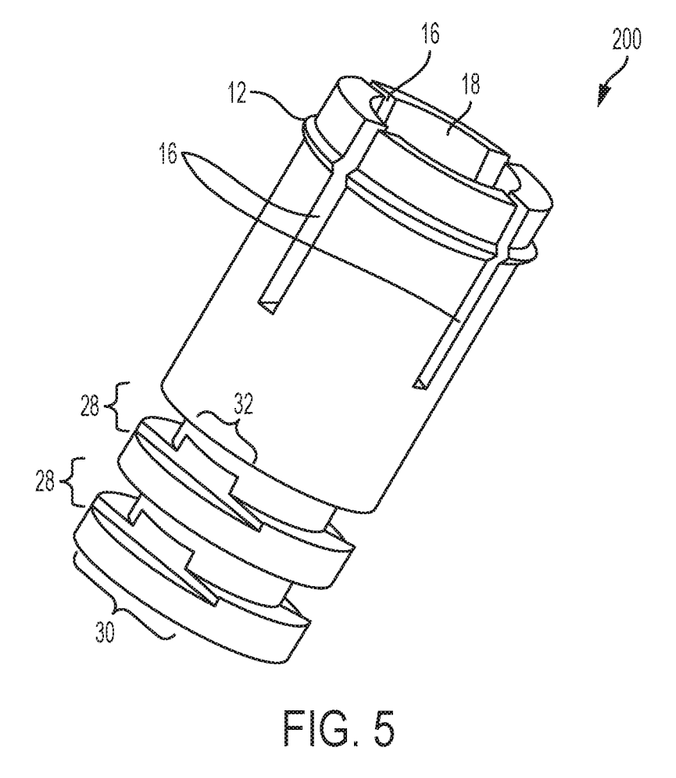
FIG. 5 shows another example of a snap-in bushing.
Figure 6:
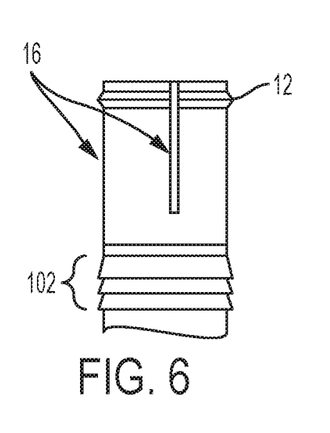
FIG. 6 shows another example of a snap-in bushing.

Check valve 24 includes one or more gas inlets 32 adjacent the sample chamber for introducing sample gases or cover gases into the sample chamber without disassembling the assembled rotor. In the exemplary embodiment, check valve 24 includes two circular cuts 30 introduced into the bottom edge of square groove 28 on opposite sides of bushing 10. Gas inlets 32 include short-length cuts 30 of various shapes introduced into a lower surface of O-ring groove 28 that allow gases to enter the sample chamber in the assembled rotor in a single flow direction when external pressure exceeds ambient internal pressure, as described in FIGS. 2A-2B. Gas inlets may have shapes including, for example, circular, oval, square, rectangular, triangular, and irregular shapes. Rectangular cuts 30 as shown in, FIG. 5, are dimensioned to be sufficiently narrow so as to allow for two O-rings, increasing the sealing ability while retaining the check valve capability. The position of cuts 30 relative to upper or lower edges of groove 28 determines the direction of flow of gases through the check valve into the sample chamber.

Figure 1A:
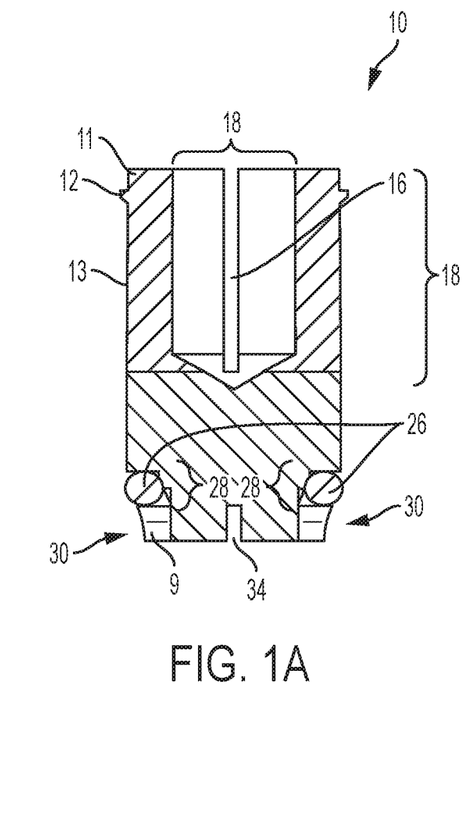
FIGS. 1A-1G show different views of one example of a snap-in bushing.
Figure 1B:
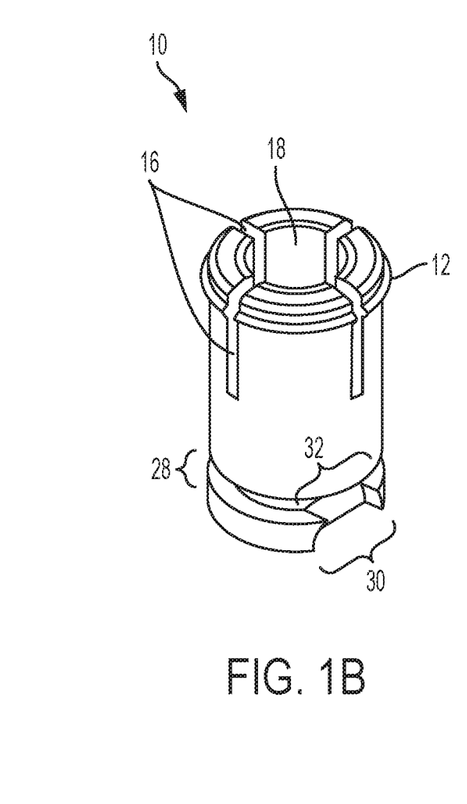
Figure 1C:
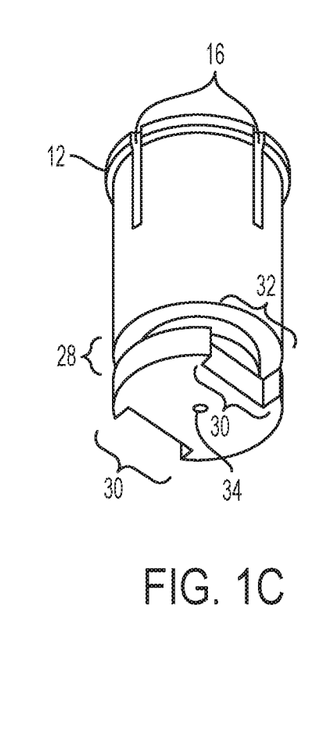
Figure 1D:
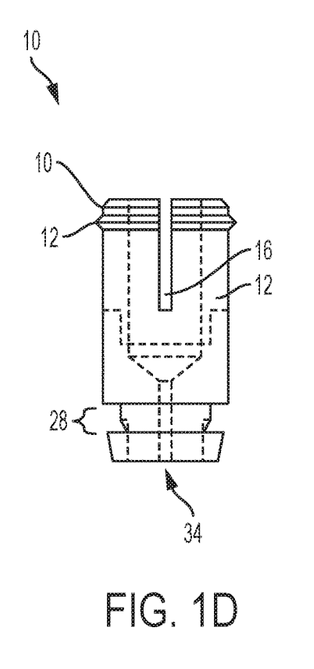
Figure 1E:
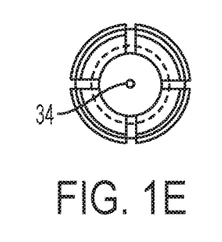
Figure 1F:
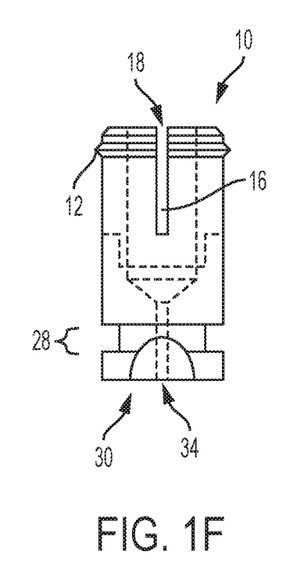
Figure 1G:
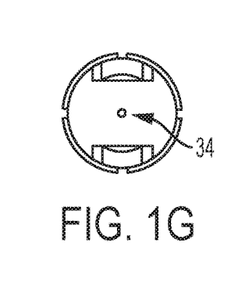
Figure 2A:
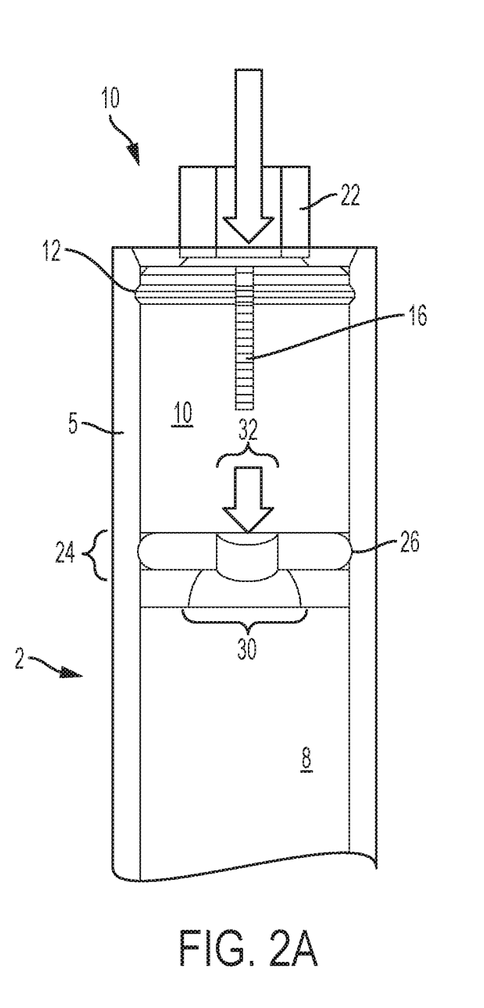
FIGS. 2A-2B illustrate an assembly of a rotor including example snap-in bushings.
Figure 2B:
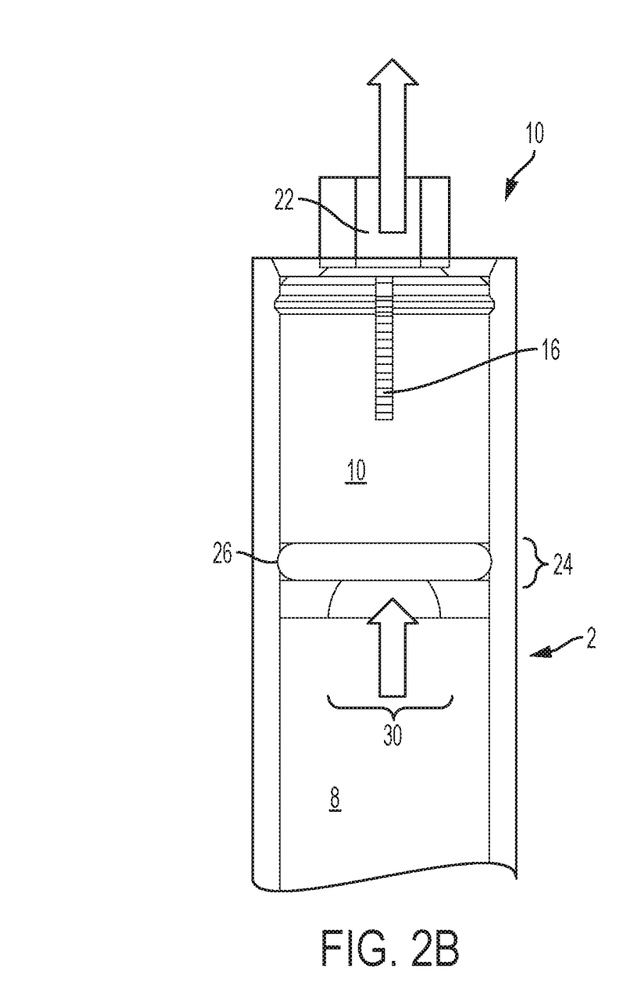
Figure 3A:
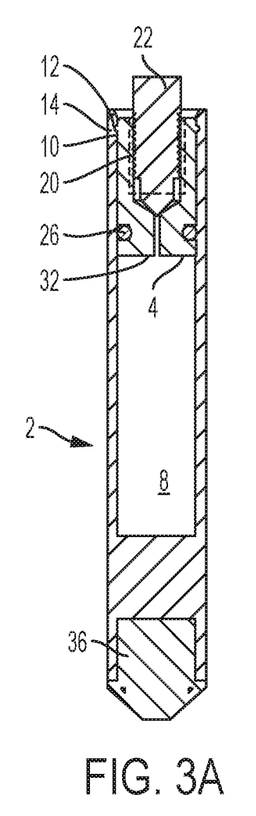
FIGS. 3A-3B show different views of an assembled rotor incorporating the snap-in bushings.
Figure 3B:
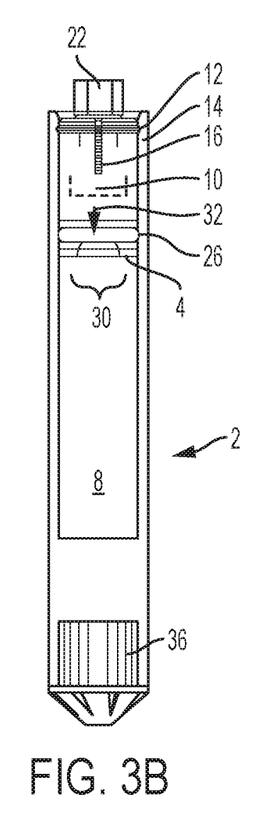
Figure 4:
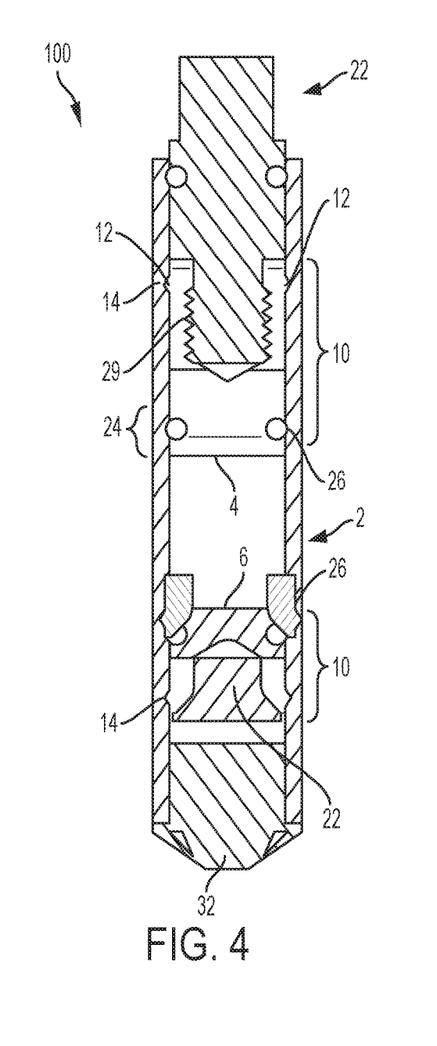
FIG. 4 shows an assembled rotor utilizing two snap-in bushings to form a sample chamber.

As shown in FIG. 3A-B and FIG. 4 various examples of the snap-in bushing and rotor sleeve are shown. When combined and in use the assembled rotor and snap-in bushings permit a wide range of temperature and pressure conditions to be maintained in the sample chamber during operation including high-temperatures and/or high-pressures, as detailed further herein. The exemplary samples showing numbers of securing ridges, inset grooves, and snap-fit couplings are not intended to be limited. For example, in some embodiments, snap-in bushings include more than one securing ridge and more than one inset groove that maintain samples in the sample chamber at still higher temperatures and/or higher pressures without loss of pressure or sample during operation. Snap-in bushings of the present invention provide various advantages. Snap-in bushings with their snap-fit couplings provide previously unattained high pressure and high temperature limits for analysis of samples in the sample chamber during operation. Snap-fit couplings secure the bushings in the rotor sleeve at an end of the rotor sleeve distal to the location of sealing O-rings that seal the sample chamber, which ensures that the highest stress point in the rotor during operation is also at the lowest temperature (due to influx of air-bearing gases introduced normally at ambient temperature) that helps maintain sample containment in the sample chamber during high pressure and/or high temperature operation. In addition, samples heated by high-temperature gases in the sample chamber during high temperature operation are positioned at the center of the rotor sleeve, which maintains the seal at operation conditions. Embodiments of the present invention described herein seal the rotor at temperatures up to the temperature limits of the polymeric materials from which they are constructed.

Snap-in bushings of the present invention provide a superior pressure limit in the sample chamber during operation, at least up to about 6000 psi (413.69 bar) or greater compared with previous bushing designs (2900 psi/200 bar limit). Snap-fit couplings secure bushings in the rotor sleeve by compression rather than tension, which enhance sealing capacity in the rotor at high pressure and/or high temperature conditions as detailed herein. Snap-in bushings of the present invention with their superior pressure and temperature limits enable the use of smaller rotors (e.g., 6 mm, 5 mm, 4 mm, or smaller) that allow higher frequency magnetic fields and higher spin speeds to be used. The higher fields and spin speeds enhance spectral resolution.

Snap-in bushings are easily installed in, and removed from, the rotor sleeves, which facilitates introduction of samples into the sample chamber and cleaning of the rotors compared to previous designs. Snap-in bushings with their O-ring check valves enhance pressurization of the sample chamber in assembled rotors without need of an external loading vessel used in previous designs equipped with a mechanical feed through. The bushings described here can be utilized with specialized sleeves or with standard commercial sleeves. Check valves further enhance the strength of the seal of the sample chamber at high-temperature and high-pressure conditions. Snap-in bushings of the present invention are chemically resistant and thus resistant to harsh chemical environments. In addition, snap-in bushings eliminate need for sealing adhesives that were previously susceptible to harsh chemical environments. Thus, sample handling is enhanced; and commercial rotor sleeves can be easily modified to accept snap-in bushings of the present invention.

TABLE 1 lists pressure and temperature conditions of various experiments conducted with snap-in bushings of the present invention.

TABLE 1

| EX. | SAMPLE | SOLVENT | GAS | ROTOR | FIELD (MHz) | PRESSURE (Bar) | TEMP[1] (° C.) |
|---|---|---|---|---|---|---|---|
| 1 | Bio-oil upgrading | — | $N_2$ or $H_2$ | 7.5 | 300 | 138 | 180 |
| 2 | Geothermal fracturing | Water | $CO_2$ | 5 | 300 | 275 | 130 |
| 3 | Lignin Decomp | Isopropanol | $H_2$ | 5 | 500 | 205 | 268 |
| 4 | | Isopropanol | $H_2$ | 7.5 | 300 | 150 | 250 |
| 5 | Biomass | Water/GVL[2] | $N_2$ | 5 | 850 | 72 | 150 |

TABLE 1-continued

| EX. | SAMPLE | SOLVENT | GAS | ROTOR | FIELD (MHz) | PRESSURE (Bar) | TEMP[1] (° C.) |
|---|---|---|---|---|---|---|---|
| 6 | conversion | Water/GVL | $N_2$ | | 7.5 | 500 | 72 | 150 |
| 7 | Temperature | Ethylene | — | 5 | 500 | — | 250 |
| 8 | reference | glycol | | 7.5 | 300 | — | 200 |
| 9 | MOF[3] | THF[4] | $H_2$ | 5 | 500 | 80 | 220 |
| 10 | Mineral/clay | water | $CO_2$[5] | 5 | 500 | 90 | 50 |

[1]Temperature of sample as measured by Lead Nitrate standard, temperature of VT gas was 5° C. to 15° C. higher.
[2]Gamma-Valerolactone.
[3]MOF—Metal Organic Framework.
[4]Tetrahydrofuran.
[5]Supercritical $CO_2$.

While a number of embodiments of the present invention have been shown and described, it will be apparent to those skilled in the art that many changes and modifications may be made without departing from the invention in its broader aspects. The appended claims are therefore intended to cover all such changes and modifications as fall within the scope of the invention.

What is claimed is:

1. A sample container assembly for a magic angle spinning nuclear magnetic resonance spectroscopy instrument, the assembly comprising:
   a rotor sleeve configured to be received within a magic angle spinning nuclear magnetic resonance spectroscopy instrument, the rotor sleeve defining an inner wall and a floor;
   a member configured to be received within the inner wall of the rotor sleeve and define a ceiling of a sample chamber within the rotor sleeve; and
   at least one ridge/groove combination between the member and rotor sleeve, the combination configured to provide a snap fit of the member within the rotor sleeve.

2. The assembly of claim 1 wherein the ridge/groove combination have complimentary non-contiguous segments of preselected lengths.

3. The assembly of claim 1 wherein the member extends between two ends and one of the ends defines a bore configured to receive a sealing plug.

4. The assembly of claim 3 wherein the ridge/groove combination comprises a single ridge extending around the one end of the member and an inset groove defined within an inner wall of the rotor sleeve.

5. The assembly of claim 3 wherein another end opposing the one end of the member further comprises a groove extending around the other end of the member, the groove configured to secure at least a portion of a gasket therein.

6. The assembly of claim 3 wherein another end opposing the one end of the member defines an inner conduit configured to allow passage of a preselected material through the conduit.

7. The assembly of claim 6 further comprising a check valve operably connected to the conduit to regulate passage of the material through the conduit and into the sample chamber.

8. The assembly of claim 3 wherein the one end of the member defines at least one slit extending normally from the one end along a length of the member and configured to provide flexure of a portion of the one end of the cylindrical member.

9. The assembly of claim 1 further comprising a pressure release port to allow depressurization of the sample chamber.

10. A method for using a magic angle spinning nuclear magnetic resonance spectroscopy instrument, the method comprising:
    providing a rotor sleeve configured to be received within a magic angle spinning nuclear magnetic resonance spectroscopy instrument, the rotor sleeve defining an inner wall and a floor;
    engaging a member within the inner wall of the rotor sleeve to define a ceiling of a sample chamber within the rotor sleeve, the engaging snap fitting the member within the rotor sleeve; and
    threading a sealing plug into the member to seal the sample chamber within the rotor sleeve and provide a pressure limit thereof to 400 bar.

11. The method of claim 10 wherein the engaging the member comprises engaging a ridge about the member with an inset groove within the rotor sleeve.

12. The method of claim 11 wherein the engaging the member comprises flexing at least a portion of the member about the ridge to couple with the inset groove.

13. The method of claim 10 wherein the engaging the member comprises sealing a portion of the member to the rotor sleeve via a gasket.

14. The method of claim 10 further comprising transferring preselected material through the member to the sample chamber.

15. The method of claim 14 further comprising regulating the transfer of the material with a check valve.

16. The method of claim 10 wherein the engaging the member comprises engaging the inner wall of the rotor sleeve to hold the member in a preselected position in relation to the sample chamber.

17. The method of claim 10 further comprising depressurizing the sample chamber via a pressure release port within the member.

18. The method of claim 10 further comprising introducing a sample or cover gas into the sample chamber through a one-way flow valve in the member prior to sample analysis.

19. The method of claim 10 further comprising introducing a gas into the sample chamber through the member at a preselected pressure and temperature.

20. The method of claim 10 wherein the engaging the member comprises flexing at least a portion of the member about the ridge to engage the inset groove and sealing a portion of the member to the rotor sleeve via a gasket; and further comprises transferring preselected material through the member to the sample chamber while regulating the transfer with a check valve.

* * * * *

UNITED STATES PATENT AND TRADEMARK OFFICE
CERTIFICATE OF CORRECTION

PATENT NO. : 10,550,889 B2
APPLICATION NO. : 15/225688
DATED : February 4, 2020
INVENTOR(S) : Eric D. Walter et al.

Page 1 of 1

It is certified that error appears in the above-identified patent and that said Letters Patent is hereby corrected as shown below:

In the Specification

Column 3, Line 35 – Replace "sleeve to-devise to define" with --sleeve to define--

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*